(12) United States Patent
Vest

(10) Patent No.: US 12,024,887 B2
(45) Date of Patent: Jul. 2, 2024

(54) METHOD OF RECYCLING USED PRINTING PLATES

(71) Applicant: MacDermid Graphics Solutions, LLC, Waterbury, CT (US)

(72) Inventor: Ryan W. Vest, Mequon, WI (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 523 days.

(21) Appl. No.: 17/159,541

(22) Filed: Jan. 27, 2021

(65) Prior Publication Data

US 2022/0235551 A1    Jul. 28, 2022

(51) Int. Cl.
| | | |
|---|---|---|
| *E04D 1/20* | (2006.01) | |
| *B29B 9/04* | (2006.01) | |
| *B29B 9/12* | (2006.01) | |
| *B29B 9/16* | (2006.01) | |

(52) U.S. Cl.
CPC ............ *E04D 1/20* (2013.01); *B29B 9/04* (2013.01); *B29B 9/12* (2013.01); *B29B 9/16* (2013.01); *B29B 2009/163* (2013.01)

(58) Field of Classification Search
CPC ..................................................... E04D 1/20
See application file for complete search history.

(56) References Cited

U.S. PATENT DOCUMENTS

| | | | |
|---|---|---|---|
| 3,852,046 A * | 12/1974 | Brown | C08J 11/06 44/628 |
| 5,270,361 A | 12/1993 | Duong et al. | |
| 5,552,261 A | 9/1996 | Kraska et al. | |
| 5,582,864 A | 12/1996 | Kiser | |
| 5,587,234 A | 12/1996 | Kiser | |
| 8,920,692 B2 | 12/2014 | Landry-Coltrain et al. | |
| 10,655,329 B1 * | 5/2020 | Redford | B32B 11/10 |
| 2004/0146806 A1 | 7/2004 | Roberts et al. | |
| 2022/0112378 A1 * | 4/2022 | Serrat | E01C 7/265 |

FOREIGN PATENT DOCUMENTS

| | | |
|---|---|---|
| DE | 19726621 A1 | 12/1998 |
| KR | 200306272 | 2/2003 |

* cited by examiner

*Primary Examiner* — William P Watkins, III
(74) *Attorney, Agent, or Firm* — Carmody Torrance Sandak & Hennessey LLP

(57) ABSTRACT

A method of producing a granulated product from photopolymer printing plate materials. The method includes the steps of (a) sorting the photopolymer printing plate materials based on an identifiable property, wherein the photopolymer printing plate materials comprise one or more photopolymer layers; (b) grinding the photopolymer printing plate materials to particles; and (c) screening the particles to remove particles above a certain size and create the granulated product.

13 Claims, No Drawings

METHOD OF RECYCLING USED PRINTING PLATES

FIELD OF THE INVENTION

The present invention relates generally to a method of recycling flexographic printing elements.

BACKGROUND OF THE INVENTION

Flexographic printing elements are typically relief plates with image elements raised above open areas. Such plates offer a number of advantages to the printer, based chiefly on their durability and the ease with which they can be made.

A typical flexographic printing blank as delivered by its manufacturer, is a multilayered article that typically includes, in order, a backing or support layer, one or more unexposed photocurable layers, a protective layer or slip film, and a cover sheet. The processed flexographic relief image printing element comprises a relief image on the surface of the printing element.

This relief image can be created by various methods. For example, in one common method, the flexographic printing element is produced by imaging the photocurable printing blank to produce a relief image on the surface of the printing element. This is generally accomplished by selectively exposing the photocurable material to actinic radiation, which exposure acts to harden or crosslink the photocurable material in the irradiated areas. The photocurable printing blank can be in the form of a continuous (seamless) sleeve or as a flat, planar plate that is mounted on a carrier.

The printing element may be selectively exposed to actinic radiation in various ways. For example, a photographic negative with transparent areas and substantially opaque areas is used to selectively block the transmission of actinic radiation to the printing plate element. Alternatively, an in situ negative is created by selectively laser ablating an actinic radiation (substantially) opaque layer on top of the one or more photopolymer layers that is sensitive to laser ablation. In still another alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Liquid photopolymers may also be used to construct flexographic printing elements and the liquid photopolymer is selectively crosslinked and cured to create the desired relief image.

Thereafter, the photopolymer layer of the printing element is developed to remove uncured (i.e., non-crosslinked) portions of the photopolymer, without disturbing the cured portions of the photopolymer layer, to produce the relief image. The development step can be accomplished in a variety of ways, including water washing, solvent washing, and thermal development (blotting).

The relief image may also be formed by selectively laser engraving photocured, photopolymerized, or vulcanized layers to produce the desired relief image.

Other methods of creating the relief image are also known to those skilled in the art.

Photopolymers used in flexographic printing elements generally contain one or more binders, monomers, plasticizers and photoinitiators, along with other performance additives. Preferred binders include polystyrene-isoprene-styrene, and polystyrene-butadiene-styrene, especially block co-polymers of the foregoing. Examples of such photopolymer compositions include those described in U.S. Patent Application Publication No. 2004/0146806 to Roberts et al., the teachings of which are incorporated herein by reference in their entirety.

Once the relief image printing element has been prepared, the flexographic printing element can be attached to a printing cylinder and printing commenced. Flexographic printing elements can be used for large volume printing jobs on various substrates, including films, foils, papers, corrugated board, paperboard, etc. and at high print speeds.

Once a printing run is complete or if a printing plate becomes worn out due to use, the printing plate must be discarded. Printing plate waste is a significant problem in the industry and companies are increasingly looking for more sustainable materials as well as ways to recycle used materials without resorting to incineration or landfilling. In addition, unused photopolymer materials, including unexposed material that is left over from the manufacture of photopolymerizable printing plate blanks, including, for example, edge strips, losses from starting and stopping production, and unusable out-of-date raw printing plates also constitute waste.

It would be desirable to develop a way to recycle and/or reuse flexographic printing plates and unused photopolymer materials that must otherwise be discarded.

In addition, it is a recognized problem that cross-linked, hardened, or vulcanized materials cannot easily be readily reprocessed, reformed, re-used or recycled to their original compositions and uses. Crosslinking of elastomeric photopolymer compositions requires complex material formulations which can cause manufacturing complexities and difficulties, including premature set-up, incomplete cure, and short composition pot-life (i.e., premature crosslinking), especially when forming relatively thick flexographic printing plate precursors.

As described above, flexographic printing plates generally consist of a backing layer, along with one or more layers of photocured material and these layers of photocured material may be the same or different from each other. Other layers include, for example, oxygen barrier layers, adhesive layers, capping layers, and antihalation layers, among others.

For many years, one of the major difficulties in recycling elastomeric photopolymer printing elements has centered around the "sandwich" that exists with the presence of the elastomeric plate material in addition to the polyester backing, plus the presence of print by-product such as dried ink. In addition, recycling unexposed and exposed photopolymers tends to be difficult because photopolymer flexographic printing plates are synthetic resin composites. Traditionally, before such photopolymers can be recycled, the bonding of the individual synthetic resins must first be dissolved. Based thereon, there remains a significant market need to develop a process in which the used printing plate material can be repurposed in a simple and cost effective manner and that overcomes the deficiencies of the prior art.

U.S. Pat. No. 5,552,261 to Kraska et al., the subject matter of which is herein incorporated by reference in its entirety, describes a process for recycling exposed and/or unexposed photopolymer flexographic printing plates containing a photopolymerizable recording layer and a support. However, this method requires that the recording layer first be separated from the support layer and other such layers.

U.S. Pat. No. 8,920,692 to Landry-Coltrain et al., the subject matter of which is herein incorporated by reference in its entirety, describes a method of recycling used and unused laser engravable flexographic printing plate precursors and laser engraved flexographic printing elements.

However, this method also requires that the laser engravable or laser engraved layer first be physically separated from the support layer and any other layers. In addition, as part of the described recycling process, the method also requires a step of melting of the laser engravable or laser engraved layer.

Therefore, it can be seen that the current methods do not provide a means of recycling or reusing the support or other layers, but only the laser engravable or laser engraved layer. Thus, the current methods still allow for significant waste associated with the disposal of the backing or support layers. There remains a need in the art for an improved process of recycling photopolymer printing plate materials that overcomes the deficiencies of the prior art.

SUMMARY OF THE INVENTION

It is an object of the present invention to provide a method of recycling flexographic printing plate precursor materials.

It is another object of the present invention to provide a method of recycling used flexographic relief image printing elements, including used printing plates and used printing sleeves.

It is still another object of the present invention provide a method of recycling flexographic printing elements and materials that does not require that backing layers, substrates layer, or other intermediate layers be removed during processing.

It is still another object of the present invention to provide a recycling method that allows the entire flexographic printing plate structure to be recycled in a simple and cost effective manner.

To that end, in one embodiment, the present invention relates generally to a method of producing a granulated product from photopolymer printing plate materials, the method comprising the steps of:
 a) sorting the photopolymer printing plate materials based on an identifiable property;
 b) grinding the photopolymer printing plate materials to particles; and
 c) screening the particles to remove particles above a certain size to produce the granulated product.

DETAILED DESCRIPTION OF THE PREFERRED EMBODIMENTS

As described herein, in one embodiment, the present invention relates generally to a method of recycling photopolymer printing plate materials in a simple, cost effective manner to produce a granulated product. This granulated product can be incorporated into various products alone or in combination with other post-consumer recycled materials.

It should be understood that the disclosed embodiments are merely illustrative of the present disclosure, which may be embodied in various forms. Therefore, details disclosed herein with reference to exemplary assemblies/fabrication methods and associated processes/techniques of assembly and use are not to be interpreted as limiting, but merely as the basis for teaching one skilled in the art how to make and use the advantageous assemblies/systems of the present disclosure.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprise(s)" and/or "comprising," specify the presence of stated features, integers, steps, operations, elements, and/or components, but do not preclude the presence or addition of one or more other features, integers, steps, operations, elements, components, and/or groups thereof.

The inventors of the present invention have determined that various elastomeric photopolymers used in printing plates, including flexographic relief image printing plates containing ink residue, along with one or more layers of photopolymer, a backing layer, and other such layers may be processed to produce a granulated product that can be used in various products. One of the major advantages of the present invention is that it is not necessary to separate out any of the layers of the printing plate and the entire printing plate, including ink residues, cured photopolymer layer(s), backing layers, and any intermediate layers can be subjected to the steps described herein to produce the granulated product.

To that end, in one embodiment, the present invention relates generally to a method of producing a granulated product from photopolymer printing plate materials, the method comprising the steps of:
 a) sorting the photopolymer printing plate materials based on an identifiable property, wherein the photopolymer printing plate materials comprise one or more photopolymer layers;
 b) grinding the photopolymer printing plate materials to produce particles or granules; and
 c) screening the particles or granules to remove particles or granules above a certain size.

In one embodiment, the photopolymer printing plate materials comprise one or more of unused photocurable or photosensitive printing blanks and used photocured and/or photopolymerized printing elements. In one preferred embodiment, the photopolymer printing plate materials comprise used photocured and/or photopolymerized printing elements as the inventors have found that these materials are more easily ground to produce the granulated product. In addition, the inventors have found that uncured printing plate materials are more hazardous and can cause irritation to workers who are handling the product.

As described herein, one of the steps of the instant invention involves identifying certain properties of the printing plate materials so that the materials can be sorted or screened by based on such identifiable properties. This allows the granulated product to be both consistent and reproducible. In one embodiment, the materials can be sorted based on the type of binder, melting point of the photopolymer materials, Shore A hardness of the photopolymer material, or other identifiable property. Thus, what is important is that the materials be sorted so that the resulting product has identifiable and consistent properties that are suitable for use in the end user product. This also allows one to identify materials that do not have any undesirable layers that are not recyclable.

In one embodiment, the inventors of the present invention have found that photopolymer printing plate materials based on styrenic block copolymer systems produce a good result. In one preferred embodiment, the photopolymer printing plate materials are based on a styrene-butadiene-styrene (SBS)-type photopolymer. In another embodiment, the photopolymer printing plate materials are based on a styrene-isoprene-styrene (SIS)-type photopolymer. While other types of photopolymers are known and would be usable in the practice of the instant invention, the inventors of the present invention have found that SBS-type photopolymer materials have greater stability and thus produce a consistent granulated product. Thus, in one embodiment, the printing plate materials are sorted to contain only those materials that contain an SBS binder.

Alternatively, the sorting step may be based on the type of printing plate (i.e., liquid or sheet polymer), thick plates versus thin plates Shore A hardness, etc. In one embodiment, the photopolymer printing plate materials may be sorted to separate plates having a Shore A hardness of less than about 40 from those plates having a Shore A hardness of greater than about 40. Alternatively, the photopolymer printing plates may be sorted to separate plates having a gauge of less than about 0.107 inches from plates having a gauge of greater than about 0.107 inches. Other sorting means would also be known to those skilled in the art. However, sorting the photopolymer printing plate materials based on the type of binder is a preferred sorting method.

Typical backing and/or support layers comprise polyesters, such as polyethylene terephthalate (PET) or polyethylene naphthalate (PEN), and these materials are suitable for being recycled along with the photocurable or photocured layers of the photopolymer printing plate materials. Therefore, these backing and/or support layers do not need to be removed prior to recycling the photopolymer printing plate materials. In addition, carbon black layers and remnants thereof also do not need to be removed from the photopolymer printing plate materials and also do not need to be removed prior to recycling the photopolymer printing plate materials. Likewise, ink residues remaining on a surface of used printing plates do not need to be removed prior to recycling the used flexographic printing plates. However, certain layers that may be contained in the photopolymer printing plate materials may be deemed to not be suitable for being recycled and/or may produce a granulated product that would not have desired properties that would be suitable for use in certain products and these certain layers can and should be removed prior to the grinding step.

Once the materials are identified and/or sorted, those sorted materials are subjected to a grinding step. This grinding step may be a single or multi-step process and the grinding step or steps may be performed cryogenically or non-cryogenically.

In one embodiment, the photopolymer printing plate materials are subjected to an initial shredding step in which the photopolymer printing plate materials are shredded to reduce the photopolymer printing plate materials to smaller chips or shreds. These chips or shreds can then be subjected to a granulation process to produce particles or granules having the desired particle size.

In non-cryogenic grinding, once the initial shredding step has been performed, a finishing mill grinds the material to the desired particle size. This step may be performed one or more times until the desired particle size has been achieved. After each processing step, the material may classified by sifting screens or other similar means that return oversize pieces to the granulator or mill for further processing. Magnets may be used to remove metal contaminants if necessary.

Cryogenic processing uses liquid nitrogen or other materials/methods to freeze the used shreds or chips prior to size reduction. Most photocurable or photocured materials described herein becomes embrittled or "glass-like" at temperatures below about −80° C. The use of cryogenic temperatures can be applied at any stage of size reduction. The material can be cooled in a tunnel style chamber, immersed in a "bath" of liquid nitrogen, or sprayed with liquid nitrogen to reduce the temperature of the granulated product. The cooled particles can be size-reduced in an impact type reduction unit, centrifuge, or hammer mill. The process reduces the photopolymer printing plate materials to a granulated product. Cryogenic grinding avoids heat degradation of the photopolymer printing plate materials and produces a high yield of the granulated product.

A wet grinding process can also be used to produce the granulated product. The wet grind process mixes the chips or shreds of the photopolymer printing plate materials with water creating a slurry. This slurry is then conveyed through size reduction and classification equipment. When the desired size is achieved, the slurry is conveyed to equipment for removing the majority of the water and then drying. Aside from the use of water, the same basic principles that are used in an ambient process are utilized in a wet grinding process.

All of these processes can be used to grind the photopolymer printing plate materials and produce the granulated product.

As described herein, the granulated product is subjected to a sizing or screening step to remove particles above a certain size. This sizing or screening step may be formed as part of the grinding step or may be a separate step performed after the grinding step.

The desired particle size is preferably within the range of less than about 20 mm, more preferably less than about 10 mm, even more preferably less than about 5 mm. In one embodiment, the particles are screened to remove particles having a diameter of greater than about 10, more preferably greater than about 5 mm.

Once the granulated product has been screened, an anti-tack agent can be added to the ground particles to prevent clumping. For example, the anti-tack agent may be selected from the group consisting of fumed silica, fillers such as talc, mica, clay, and carbonate, metallic stearates such as zinc stearate, magnesium stearate, and calcium stearate, potassium stearate, stearic acid, liquid lubricants, emulsified wax, and calcium silicate, among others. In one embodiment, the anti-tack agent comprises fumed silica.

The granulated product can be used to replace post-consumer recycled material, in whole or in part in various building materials and other products. Thus the used flexographic printing elements and/or unused photocurable printing blank materials can be used to produce a granulated product to replace PCRM in building materials such as asphalt shingles.

In one embodiment, the sustainable product is a roofing tile or roofing shingle and the ground material is used in combination with other materials to produce a roofing tile or roofing shingle incorporating a large concentration of ground recycled material. Other materials include, but are not limited to, asphalt, paving materials, and synthetic building materials, including synthetic lumber, by way of example.

Example 1

Photopolymer printing plate materials were evaluated and sorted to remove any photopolymer printing plate materials not utilizing a styrene-butadiene-styrene binder to leave only photopolymer printing plate materials based on styrene-butadiene-styrene photopolymers and comprising a polyethylene terephthalate (PET) backing layer. These photopolymer printing plate materials were ground to produce a granulated product. The granulated product was then screened to remove particles larger than 10 mm in size.

Example 2

A Silverson Model L5M-A High Shear mixer with a slotted vertical head was used to mix the granulated product produced in Example 1 with asphalt.

The granulated product was mixed with a paving grade asphalt (PG64-22). The PG grading system is defined by two numbers which represent pavement temperatures. The first number represents the high pavement temperature in degrees Celsius and the second number represent the low pavement temperature. The high temperature relates to the effects of rutting and the low temperature relates to cold temperature and fatigue cracking.

The granulated product was mixed with the asphalt for a period of 60 minutes at a temperature of 375° F.

The starting point was to blend at 5% by weight and 7% by weight of the particles to determine material characteristics and behavior in the asphalt plus potency compared to raw flux and percentage increase.

It was observed that the material blended well but not all of the material blended into the asphalt. A portion of the granulated product adhered to the interior surface of the mix can after manual agitation. In addition, material also adhered to the viscosity spindle and to the mix head.

Results of the blending and testing produced good results and revealed the potency and compatibility of the granulated product with asphalt. In addition, there was no odor observed during the blending step.

Example 3

The granulated product of Example 1 was evaluated to test the compatibility of the product with other post-consumer recycled materials (PCRM) and polymers.

A complex formulation was selected that normally consists of 5% PCRM+3% polymer+3% polymer to 3% PCRM. 2.5% of the 5% PCRM was replaced with 2.5% of the granulated product of Example 1. The blend results revealed that the granulated product was compatible with other PCRM and other types of polymer. It was also observed that the testing results were slightly better than the control results.

Example 4

For the next blend, the 5% PCRM was totally replaced with 5% of the granulated product of Example 1. This material was blended filled and unfilled. These test results were also better than the control results.

The examples demonstrated that the granulated product described herein is a viable product to replace at least a portion of PCRM in asphalt compositions. It is also contemplated that the granulated product described herein can be used to replace at least a portion of PCRM in building materials and other products that contain a portion of PCRM.

Finally, it should also be understood that the following claims are intended to cover all of the generic and specific features of the invention described herein and all statements of the scope of the invention that, as a matter of language might fall therebetween.

What is claimed is:

1. A method of producing a granulated product from photopolymer printing plate materials, the method comprising the steps of:
   a) sorting the photopolymer printing plate materials based on an identifiable property;
   b) grinding photopolymer printing plate materials to particles; and
   c) screening the particles to remove particles above a certain size to produce the granulated product;
      wherein the photopolymer printing plate materials comprise used photocured or photopolymerized flexographic printing elements comprising one or more cured photopolymer layers on a support layer, and wherein the support layer is not removed from the one or more photopolymer layers prior to the grinding step.

2. The method according to claim 1, wherein the one or more cured photopolymer layers comprise a binder selected from styrene-isoprene-styrene and styrene-butadiene-styrene.

3. The method according to claim 2, wherein the binder comprises styrene-butadiene-styrene.

4. The method according to claim 1, wherein the identifiable property is selected from the group consisting of type of binder, Shore A hardness of the photopolymer, printing plate gauge, and combinations of one or more of the foregoing.

5. The method according to claim 1, wherein the granulated product has a particle size of less than 20 mm.

6. The method according to claim 5, wherein the granulated product has a particle size of less than 10 mm.

7. The method according to claim 6, wherein the granulated product has a particle size of less than 5 mm.

8. The method according to claim 1, wherein an anti-tack agent is added to the granulated product after step c).

9. The method according to claim 1, wherein the anti-tack agent is selected from the group consisting of fumed silica, talc, mica, clay, carbonate, zinc stearate, magnesium stearate, calcium stearate, potassium stearate, stearic acid, liquid lubricants, emulsified wax, and calcium silicate.

10. An asphalt shingle comprising the granulated product of claim 1.

11. The asphalt shingle according to claim 10, wherein the asphalt shingle comprises asphalt and the granulated product, wherein the asphalt shingle comprises about 5% by volume to about 10% by volume of the granulated product.

12. A method of preparing asphalt shingles, the method comprising the step of blending the granulated product of claim 1 with asphalt.

13. The method according to claim 12, where the step of blending the granulated product with the asphalt comprises mixing the granulated products with the asphalt for a period of about 30 to about 60 minutes at a temperature of between about 350 to about 400° F.

* * * * *